(12) United States Patent
Brewer et al.

(10) Patent No.: US 9,262,084 B2
(45) Date of Patent: *Feb. 16, 2016

(54) NON-VOLATILE MEMORY CHANNEL CONTROL USING A GENERAL PURPOSE PROGRAMMABLE PROCESSOR IN COMBINATION WITH A LOW LEVEL PROGRAMMABLE SEQUENCER

(71) Applicant: Seagate Technology LLC, Cupertino, CA (US)

(72) Inventors: Christopher Brewer, Cupertino, CA (US); Earl T. Cohen, Cupertino, CA (US)

(73) Assignee: Seagate Technologies LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/729,659

(22) Filed: Jun. 3, 2015

(65) Prior Publication Data

US 2015/0268870 A1  Sep. 24, 2015

Related U.S. Application Data

(63) Continuation of application No. 13/768,215, filed on Feb. 15, 2013, now Pat. No. 9,081,666.

(51) Int. Cl.

| | |
|---|---|
| *G06F 3/00* | (2006.01) |
| *G06F 3/06* | (2006.01) |
| *G06F 13/16* | (2006.01) |
| *G11C 5/04* | (2006.01) |
| *G06F 9/38* | (2006.01) |

(Continued)

(52) U.S. Cl.
CPC ............ *G06F 3/0613* (2013.01); *G06F 3/0659* (2013.01); *G06F 3/0688* (2013.01); *G06F 9/38* (2013.01); *G06F 12/0246* (2013.01); *G06F 13/1694* (2013.01); *G11C 5/04* (2013.01); *G06F 13/385* (2013.01)

(58) Field of Classification Search
CPC ...... H04L 29/06; H04L 69/18; G06F 13/1694; G06F 3/0613; G06F 3/0688; G06F 3/0659; G06F 12/0246; G06F 9/38; G06F 13/385; G11C 5/04
USPC ................ 710/14, 312; 711/170, 4, 103, 154; 712/245; 326/46

See application file for complete search history.

(56) References Cited

U.S. PATENT DOCUMENTS

| 5,448,709 A | 9/1995 | Chandler et al. ............. 395/872 |
|---|---|---|
| 5,469,548 A | 11/1995 | Callison et al. ............... 395/441 |
| 5,719,880 A | 2/1998 | Leung ........................... 714/733 |

(Continued)

*Primary Examiner* — Hong Kim
(74) *Attorney, Agent, or Firm* — Christopher P. Maiorana, PC

(57) ABSTRACT

An apparatus includes a device interface, a micro-sequencer, and a programmable sequence memory. The device interface may be configured to process a plurality of read/write operations to/from one or more non-volatile memory devices. The micro-sequencer may be configured to communicate with the device interface. The programmable sequence memory is generally readable by the micro-sequencer. In response to the apparatus receiving a command, (a) the micro-sequencer executes a set of instructions starting at a location in the programmable sequence memory according to the command and (b) the micro-sequencer is enabled to perform at least a portion of the command according to a protocol of the one or more non-volatile memory devices, when the one or more non-volatile memory devices are coupled to the device interface.

20 Claims, 12 Drawing Sheets

(51) Int. Cl.
    *G06F 12/02*     (2006.01)
    *G06F 13/38*     (2006.01)

(56) References Cited

U.S. PATENT DOCUMENTS

| | | | |
|---|---|---|---|
| 5,893,136 A | 4/1999 | Stolt et al. | 711/105 |
| 5,918,242 A | 6/1999 | Sarma et al. | 711/5 |
| 6,336,174 B1 | 1/2002 | Li et al. | 711/162 |
| 6,505,282 B1 | 1/2003 | Langendorf et al. | 711/170 |
| 6,650,593 B2 | 11/2003 | Takemae | 365/233.16 |
| 6,721,212 B2 | 4/2004 | Sasaki | 365/189.11 |
| 6,826,680 B2 | 11/2004 | Muller | 712/226 |
| 7,308,526 B2 | 12/2007 | Lakshmanamurthy et al. | 711/104 |
| 7,464,259 B2* | 12/2008 | Sukegawa et al. | 713/2 |
| 7,673,190 B1* | 3/2010 | Engelbrecht et al. | 714/49 |
| 7,836,382 B2* | 11/2010 | Dickin et al. | 714/776 |
| 8,245,101 B2 | 8/2012 | Olbrich et al. | 714/753 |
| 8,291,295 B2 | 10/2012 | Harari et al. | 714/763 |
| 2002/0046324 A1* | 4/2002 | Barroso et al. | 711/122 |
| 2004/0133758 A1 | 7/2004 | Matsuda | 711/167 |
| 2005/0097271 A1* | 5/2005 | Davies et al. | 711/114 |
| 2006/0133160 A1 | 6/2006 | Dickin et al. | 365/189.05 |
| 2006/0168373 A1 | 7/2006 | Broome et al. | 710/62 |
| 2006/0168374 A1* | 7/2006 | Wray et al. | 710/62 |
| 2006/0168429 A1* | 7/2006 | Short et al. | 712/228 |
| 2009/0213645 A1 | 8/2009 | Parkinson et al. | 365/163 |
| 2009/0300278 A1 | 12/2009 | Kruger | 711/105 |
| 2010/0293420 A1 | 11/2010 | Kapil et al. | 714/710 |
| 2013/0031328 A1 | 1/2013 | Kelleher et al. | 711/203 |
| 2014/0215123 A1 | 7/2014 | Baryudin et al. | 711/103 |

\* cited by examiner

NON-VOLATILE MEMORY CHANNEL CONTROL USING A GENERAL PURPOSE PROGRAMMABLE PROCESSOR IN COMBINATION WITH A LOW LEVEL PROGRAMMABLE SEQUENCER

This application relates to U.S. Ser. No. 13/768,215, filed Feb. 15, 2013, now U.S. Pat. No. 9,081,666, issued Jul. 14, 2015, which is incorporated by reference in its entirety.

FIELD OF THE INVENTION

The invention relates to memory systems generally and, more particularly, to a method and/or apparatus for implementing non-volatile memory channel control using a general purpose programmable processor in combination with a low level programmable sequencer.

BACKGROUND

Conventional non-volatile memory control systems attempt to use a number of different protocols to give flexibility in the range of devices that can be used by the systems. Supporting the number of different protocols involves dedicated control logic for each envisioned type of interface, and for each required interface command type. Relying on dedicated control logic for each interface protocol is not a very flexible approach, and requires expensive redesign of logic for new or slightly changed versions of the interface protocols. Alternatively, a central processing unit (CPU) can be used to allow some flexibility of low level control of the non-volatile memory interface. However, this places a high burden on the CPU and hence results in limited performance.

It would be desirable to implement non-volatile memory channel control using a general purpose programmable processor in combination with a low level programmable sequencer.

SUMMARY

The present invention concerns a system including a control processor, a non-volatile memory device interface, and a micro-sequencer. The control processor may be configured to receive commands and send responses via a command interface. The non-volatile memory device interface may be configured to couple the system to one or more non-volatile memory devices. The micro-sequencer is generally coupled to (i) the control processor and (ii) the non-volatile memory device interface. The micro-sequencer includes a control store readable by the micro-sequencer and writable by the control processor. In response to receiving a particular one of the commands, the control processor is enabled to cause the micro-sequencer to begin executing at a location in the control store according to the particular command and the micro-sequencer is enabled to perform at least a portion of the particular command according to a protocol of the one or more non-volatile memory devices coupled to the non-volatile memory device interface.

BRIEF DESCRIPTION OF THE DRAWINGS

Embodiments of the invention will be apparent from the following detailed description and the appended claims and drawings in which:

DETAILED DESCRIPTION OF EMBODIMENTS

Embodiments of the invention include method(s) and/or apparatus for implementing non-volatile memory (e.g., flash, etc.) channel control using a general purpose programmable processor in combination with a low-level programmable sequencer. Embodiments of the invention may (i) couple a general purpose central processing unit (CPU) for high level control and scheduling with a programmable micro-sequencer for low-level control of a non-volatile memory interface, (ii) use a micro-sequencer to provide clock cycle by clock cycle control of a non-volatile memory interface in a manner defined by sequence programming, (iii) enable a micro-sequencer to be programmed to handle any planned non-volatile memory interface, (iv) allow the programming of future non-volatile memory interfaces not yet envisioned, (v) use a micro-sequencer to provide instructions to control non-volatile memory pin outputs, to control data output and data capture, to configure interface operation modes, and/or to loop through defined sequences a configured number of times (without incurring pipeline delays), (vi) use a micro-sequencer to provide an ability to handle data starvation and data back pressure cases in a configurable manner, (vii) implement a shared memory between the CPU and the micro-sequencer to allow sequence parameters to be passed and micro-sequence control code to be easily altered, (viii) pass requests to execute sequences to the micro-sequencer and generate responses from the micro-sequencer only when the sequences are completed or an error case is encountered, and/or (ix) free up the CPU to perform higher level scheduling, management and decision making.

Figure 1:
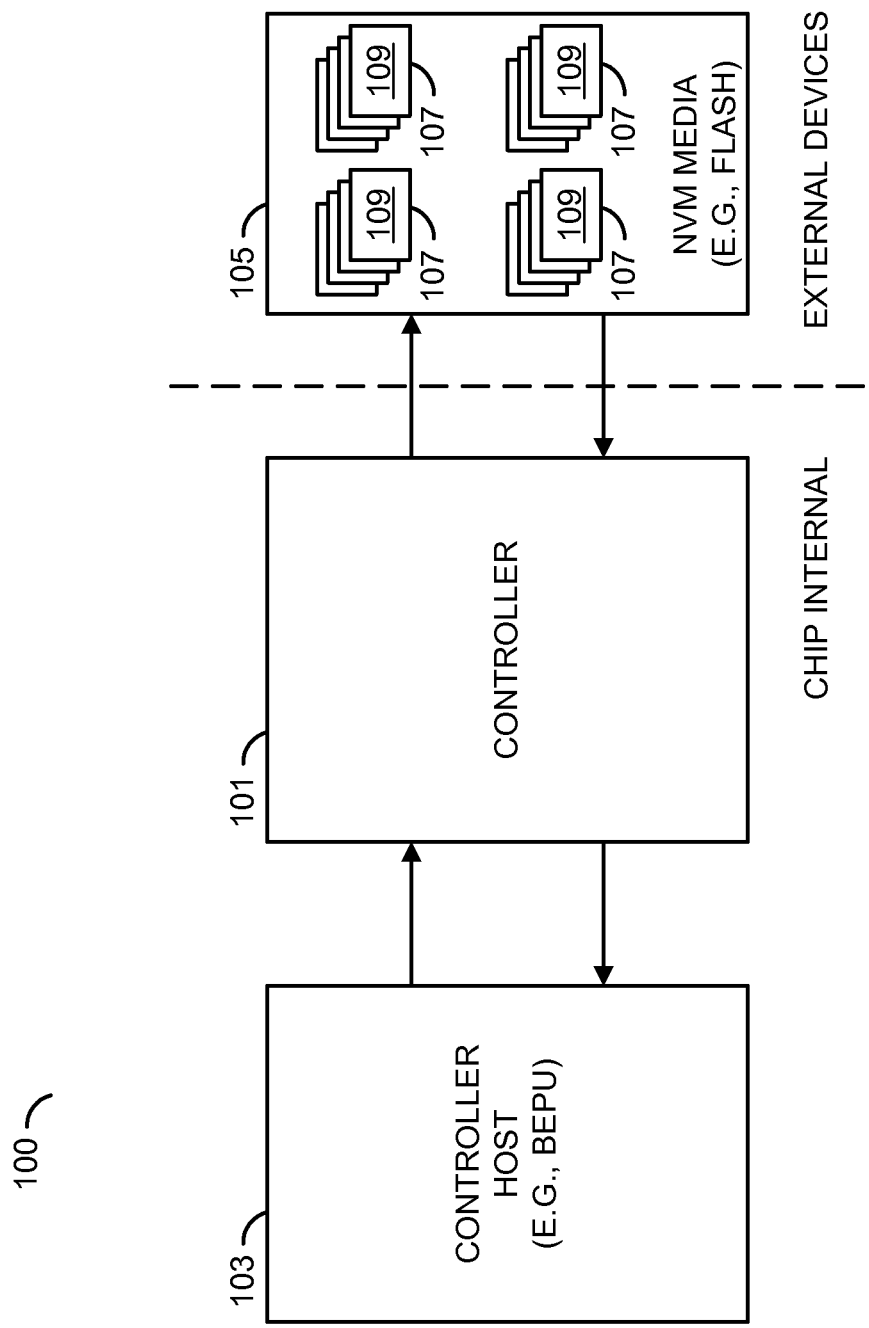
FIG. 1 is a diagram illustrating a non-volatile memory control system in accordance with an embodiment of the invention.

Referring to FIG. 1, a diagram is shown illustrating a non-volatile memory control system 100 in accordance with an embodiment of the invention. In some embodiments, the non-volatile memory control system 100 comprises a block 101 and a block 103. The block 101 may implement a memory channel controller, also referred to as an interface management processor (IMP). The block 103 may implement a controller host. The controller 101 may be configured to control one or more individual non-volatile memory channels. In some embodiments, multiple instances of the controller 101 may be implemented to control a plurality of non-volatile memory channels. The controller 101 has a command interface configured to receive commands and send responses to the host 103. The host 103 may comprise, for example, a back end processing unit (BEPU). In embodiments implementing a plurality of non-volatile memory channels, the host 103 also includes multiplexing circuitry coupling the multiple instances of the controller 101 to the BEPU. In some embodiments, the host 103 is an I/O device controller, such as a solid-state disk (SSD) controller, and the BEPU is a portion of the controller providing scheduling and/or data management of a plurality of non-volatile memory devices, such as NAND flash non-volatile memory chips. In further embodiments, the BEPU comprises data buffering and direct memory access (DMA) engines to store data or other information and to move the data or other information between the host 103 and the controller 101.

The controller 101 also has a non-volatile memory interface configured to couple the system 100 to non-volatile memory media 105. The non-volatile memory media 105 may comprises one or more non-volatile memory devices 107. The non-volatile memory devices 107 have, in some embodiments, one or more non-volatile memory die 109. According to a type of a particular one of the non-volatile memory devices 107, a plurality of non-volatile memory die 109 in the particular non-volatile memory device 107 are optionally and/or selectively accessible in parallel. The non-volatile memory devices 107 are generally representative of one type of storage device enabled to communicatively couple to controller 101. However, in various embodiments, any type of storage device is usable, such as SLC (single level cell) NAND flash memory, MLC (multi-level cell) NAND flash memory, TLC (triple level cell) NAND flash memory, NOR flash memory, read-only memory (ROM), static random access memory (SRAM), dynamic random access memory (DRAM), magneto-resistive random-access memory (MRAM), ferromagnetic memory (e.g., FeRAM, F-RAM FRAM, etc.), phase-change memory (e.g., PRAM, PCRAM, etc.), racetrack memory (or domain-wall memory (DWM)), resistive random-access memory (RRAM or ReRAM), or any other type of memory device or storage medium.

In some embodiments, the controller 101 and the non-volatile memory media 105 are implemented on separate integrated circuits. When the controller 101 and the non-volatile memory media 105 are implemented as separate integrated circuits (or devices), the non-volatile memory interface of the controller 101 is generally enabled to manage a plurality of data input/output (I/O) pins and a plurality of control I/O pins. The data I/O pins and the control I/O pins may be configured to connect the device containing the controller 101 to the external devices forming the non-volatile memory media 105.

Figure 2:
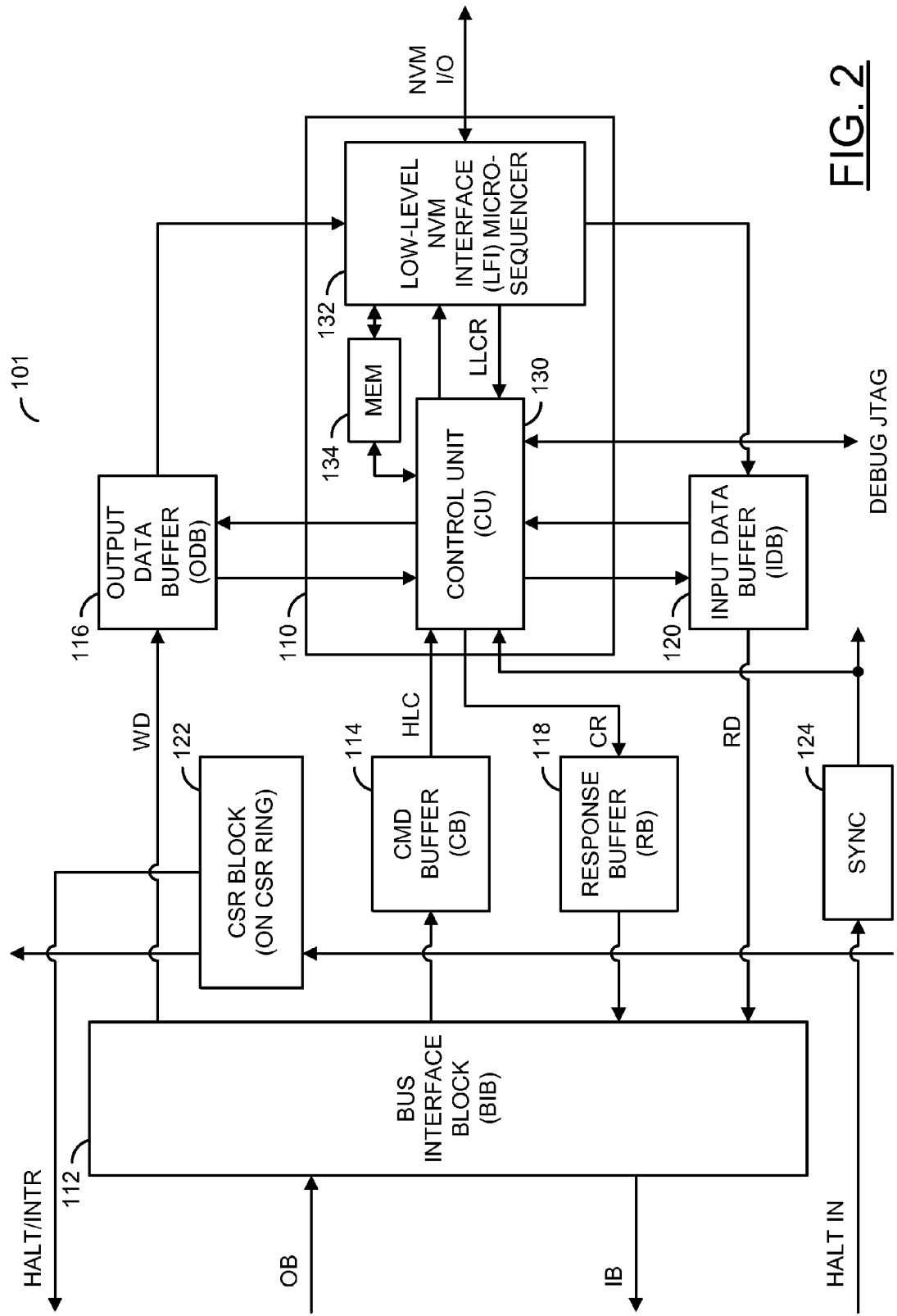
FIG. 2 is a diagram illustrating a interface management processor in accordance with an embodiment of the invention.

Referring to FIG. 2, a diagram is shown illustrating an implementation of the controller 101 in accordance with an embodiment of the invention. In some embodiments, the controller 101 implements an interface management processor (IMP). In some embodiments, the controller 101 comprises a block (or circuit) 110, a block (or circuit) 112, a block (or circuit) 114, a block (or circuit) 116, a block (or circuit) 118, a block (or circuit) 120, a block (or circuit) 122, and a block (or circuit) 124. The block 110 generally implements silicon logic and firmware configured to control multiple non-volatile memory devices in a way that is configurable, flexible and extensible. The block 112 implements a bus interface block (BIB). The block 114 implements a command buffer (CB). The block 116 implements an output data buffer (ODB). The block 118 implements a response buffer (RB). The block 120 implements an input data buffer (IDB). The block 122 implements a configuration/status register (CSR) block. The block 124 implements a synchronization block.

The bus interface block (BIB) 112 handles the communication to and from the back end processing unit (e.g., the host 103). The BIB 112 processes low level data link commands received from the BEPU via an output bus (e.g., OB) and passes commands and data to the command buffer 114 and the output data buffer 116. The BIB 112 also sends command responses from the response buffer (RB) 118 and input data from the input data buffer (IDB) 120 to the back end processing unit via an input bus (e.g., IB). The command buffer (CB) 114 accumulates output bus words into hardware control port (HCP) dwords and feeds the HCP dwords to the CU 130. The term dwords (or double-words) represents a unit of data transfer in a single cycle (e.g., eight bytes). The response buffer (RB) 118 takes HCP dwords from the CU 130, breaks the HOP dwords down into multiple input bus words, and sends the multiple input bus words to the BIB 112. In some embodiments, the HCP dwords comprise messages sent between the BEPU and the CU 130. For example, the BEPU sends messages to the CU 130 to add non-volatile memory device access operations to a queue of work maintained by CU 130, and the CU 130 sends messages back to the BEPU indicating completion and/or status of the operations. In further embodiments, the messages from the BEPU comprise respective tags associated with data transfer of the operations, and the CU 130 is enabled to use the tags to initiate a fetch of data to be written to the non-volatile memory devices, or to indicate an operation-specific destination for data read from the non-volatile memory devices.

The CSR block 122 sits on a CSR ring of the system 100. The CSR block 122 provides access to interface management processor (IMP) information and configures IMP operation via registers of the CSR block 122. For example, registers of the CSR block 122 enable the CU 130 to run, provide status of the CU 130 operation, enable debug and/or diagnostic features of controller 101, and other management access features. The CSR ring may be implemented using any of a number of bus specifications (e.g., PalmBus, AMBA, AHB, etc.). In various embodiments, a number (e.g., 2) of priority interrupt signals and a halt signal (e.g., HALT/INTR) may be sent to the back end processing unit. The back end processing unit may be configured to synchronize the priority interrupt signals and the halt signal to a core domain. The block 124 may be configured to synchronize a global halt input (e.g., HALT IN) to a clock domain of the controller 101. The synchronized global halt input, under CSR control, can then halt the controller 101.

The block 110 generally comprises a control unit (CU) 130 and a low-level non-volatile memory interface (LFI) 132. The CU 130 generally comprises a general purpose central processing unit (CPU). The LFI 132 comprises a low-level programmable micro-sequencer. The CU 130 and the low-level programmable micro-sequencer of the LFI 132 are tightly coupled by a shared memory (e.g., represented by the block 134). The CU 130 and the low-level programmable micro-sequencer of the LFI 132 are enabled to control system outputs and inputs (e.g., NVM I/O) that connect to one or more non-volatile memory devices (e.g., the non-volatile memory media 105 of FIG. 1). The CU 130 can receive commands from an overall system controller and is responsible for (i) making decisions about what commands to issue to the low-level programmable micro-sequencer of the LFI 132, (ii) controlling the flow of data to/from a central system data repository, (iii) handling potential error conditions, and (iv) sending responses to the overall system controller to indicate completion of commands.

The low-level programmable micro-sequencer of the LFI 132 may be configured with a program to address and control the particular type of non-volatile memory device(s) that is(are) attached. The low-level programmable micro-sequencer of the LFI 132 may thus abstract away from the CU 130 details about the particular non-volatile memory interface protocol and provide higher level sequence calls to the CU 130. The CU 130, low-level programmable micro-sequencer of the LFI 132, and programs for each generally allow the overall system controller to issue commands to the non-volatile memory controller 101 that are of a high level. The program for the CU 130 handles scheduling of the higher level commands (e.g., for one or more non-volatile memory devices), breaks the higher level commands into lower level commands, and issues the lower level commands to the low-level programmable micro-sequencer of the LFI 132. When the commands are completed, the program issues the response to the BEPU controller. This frees the BEPU and/or other processors of the host 103 from having to handle details of the non-volatile memory interface. As new non-volatile memory devices are introduced, the new devices are usable with the flexible style approach described above by simply developing new programs for the CU 130 and the low-level programmable micro-sequencer of the LFI 132.

The LFI 132 is able to detect a data interruption, such as due to backpressure when receiving data from the non-volatile memory media, or a lack of data when sending data to the non-volatile memory media. The low-level programmable micro-sequencer of the LFI 132 is also able to "break" out of a programming loop to enter an exception state. In the exception state, the low-level programmable micro-sequencer of the LFI 132 can, in a first mode, detect the resumption of data and continue operation, or in a second mode, interrupt the CU 130 to have a higher-level restart of the operation. In the second mode, the CU 130 has access to an amount of data transferred by the low-level programmable micro-sequencer of the LFI 132 and can, for example, adjust addresses and/or lengths to restart the data transfer from the point at which the data transfer was suspended.

The CU 130 interprets interface management processor commands and provides responses. The CU 130 also has access to the input data buffer and the output data buffer, and controls the LFI 132. The LFI 132 accesses and controls the non-volatile memory I/O, sequences commands, sequences data output, and captures data return. A large portion of the functionality of the CU 130 is implemented in firmware to allow flexibility and support of future non-volatile memory types.

Figure 3:
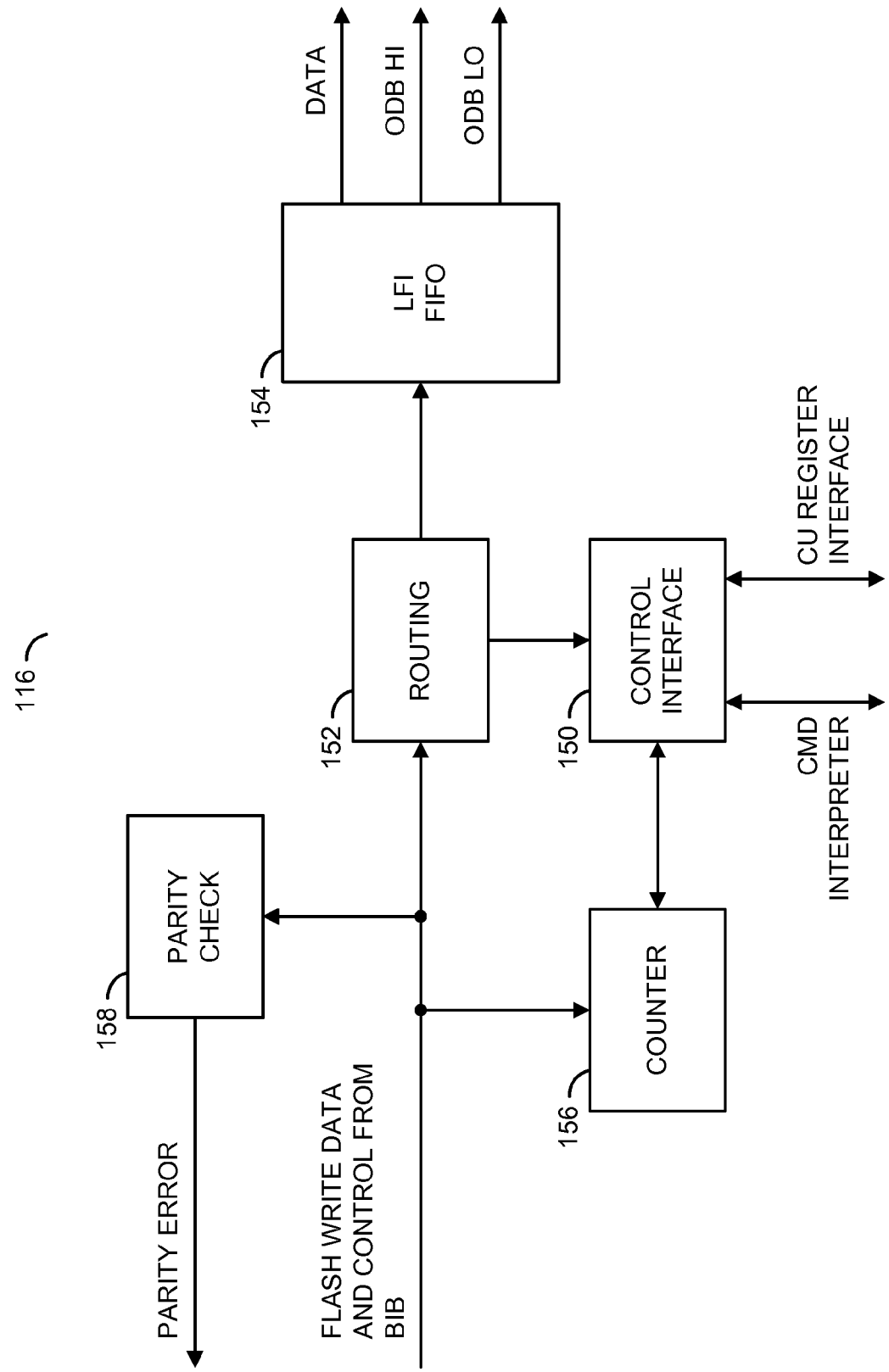
FIG. 3 is a diagram illustrating an example implementation of an output data buffer of FIG. 2.

Referring to FIG. 3, a diagram is shown illustrating an example implementation of the output data buffer (ODB) 116 of FIG. 2. In some embodiments, the ODB 116 comprises a block (or circuit) 150, a block (or circuit) 152, a block (or circuit) 154, a block (or circuit) 156, and a block (or circuit) 158. The block 150 generally implements a control interface. The block 152 is generally enabled to perform routing operations. The block 154 implements a first-in-first-out (FIFO) buffer. The block 156 implements a counter. The block 158 is generally enabled to perform a parity check.

In a first (e.g., normal) mode of operation, control and routing can be setup to direct incoming data directly to the LFI 132. For debug or other advanced functions, control and routing can be setup to direct incoming data directly to a CU register interface. For a CU firmware download, control and routing can be setup to direct incoming data directly to a command interpreter of the CU 130. In one example, the block 154 may be implemented as an 8-bit wide, 4 entry deep FIFO buffer. However, other depths and widths may be implemented to meet the design criteria of a particular implementation. The block 154 has configurable Hi and Lo levels (e.g., FIFO thresholds) that are used as part of sequence control. Typically for a 4 deep, double data rate (DDR) system, Hi would be set to 2 and Lo to 1. For a 4 deep, single data rate system, Hi would be 1 and Lo 0. The block 156 may be implemented as a CU CSR accessible counter configured to count the number of bytes received by the ODB 116. The block 156 is also writable by the CU 130 and may be useful in debugging as a check that the correct number of bytes are received from the write data path. The block 158 is enabled to check data interface parity and report parity errors to the CSR block 122, which is enabled to signal an interrupt to the BEPU for exceptions such as parity errors.

Figure 4:
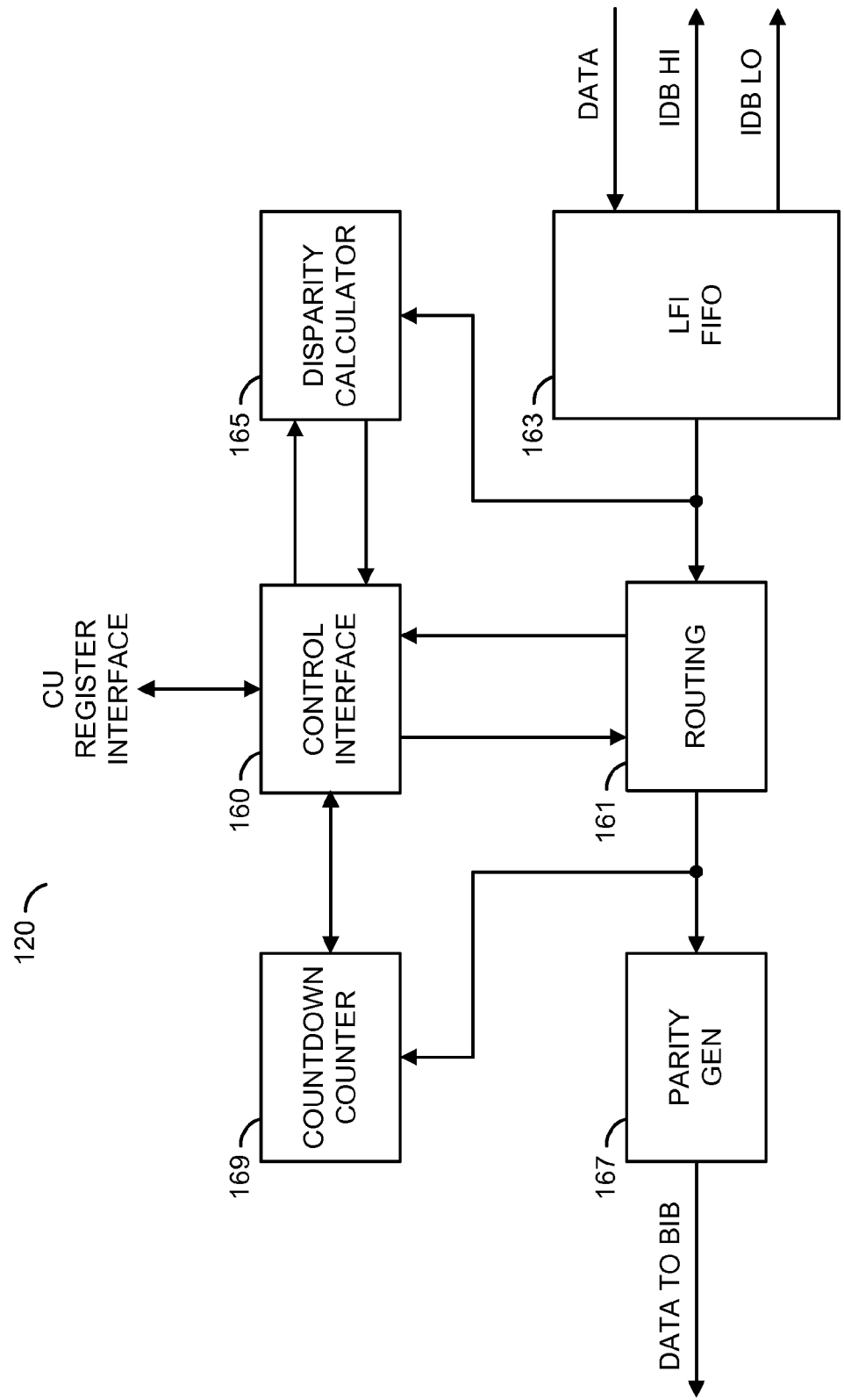
FIG. 4 is a diagram illustrating an example implementation of an input data buffer of FIG. 2.

Referring to FIG. 4, a diagram is shown illustrating an example implementation of the input data buffer (IDB) 120 of FIG. 2. In some embodiments, the IDB 120 comprises a block (or circuit) 160, a block (or circuit) 161, a block (or circuit) 163, a block (or circuit) 165, a block (or circuit) 167, and a block (or circuit) 169. The block 160 generally implements a control interface. The block 161 is generally enabled to perform routing operations. The block 163 implements a first-in-first-out (FIFO) buffer. The block 165 implements a disparity calculator. The block 167 implements a parity generator. The block 169 implements a countdown counter.

The IDB 120 generally receives incoming data from the LFI via the block 163. In some embodiments, the block 163 may be implemented as an 8-bit wide, 40 entry FIFO buffer. However, other depths and widths may be implemented accordingly to meet the design criteria of a particular implementation. The block 163 has configurable Hi and to levels (e.g., FIFO thresholds) for use in flow control at the LFI 132. The block 163 allows for round trip latencies in the system 100 that can be significant (e.g., 30 ns) at fast transfer rates, and also allows time at the start of a transfer to insert message headers from the CU 130 while buffering incoming data in the FIFO buffer. Example settings of the Hi and Lo levels (e.g., FIFO thresholds) for a double data rate system would be 22 for Hi and 21 for Lo.

Data from the LFI 132 is generally directed to an outgoing FIFO buffer (not shown) that connects the IDE 120 to the BIB 112. The data from the LFI 132 can also be read by the CU 130 using a CU register interface of the control interface 160 (e.g., this feature can be used for non-volatile memory device register reads, status reads, etc., where the data is consumed by the CU 130). The CU register interface can also be used to send data to the BIB 112 from the CU 130 (e.g., this feature can be used for data headers/trailers).

The block 165 generally implements a running disparity calculator. In some embodiments, the running disparity calculator keeps a signed 20-bit running total of the excess of 1 bits compared to 0 bits in the read data stream. An example disparity calculation is shown by the following Equation 1:

$$\text{Disparity} = \text{Total bits set to } 1 - (\text{Total bits}/2) \quad \text{EQ. 1}$$

The disparity value saturates and sticks if the disparity value reaches the max positive or negative 20-bit value. When data read from the non-volatile memory devices has a known expected disparity, the disparity calculation is used, at least in part, to determine if the read data is valid. In a first example, if the data read from the non-volatile memory devices was encrypted and/or scrambled and had a known statistically 50-50 distribution of 0's and 1's, the disparity would be expected to be close to 0. In a second example, some non-volatile memory devices, such as NAND flash, have an erased state that is all 1's. If the disparity calculation indicates that substantially all of the data bits read have the value 1, then an erased page is likely to have been read.

When the data read has completed, the disparity value can be read by the CU 130 and included in the data trailer, or returned as a response to the BEPU. The CU 130 should usually clear the disparity value before the start of a data transfer. The outgoing data stream is parity protected by the block 167.

The block 169 generally implements a CSR accessible down-counter. The block 169 counts down the number of bytes sent from the IDB 120. This can be set to the length of a transfer and will count down to zero at the expected end of a transfer. The block 169 can also be programmed by a CSR register of the CU 130 to generate first/last indications (e.g., sideband signals providing framing information) at the start/end of a transfer. A second CSR register is used to preset the block 169 after the counter reaches the zero level.

When the outgoing data to the BIB 112 is generated by the CU 130 (e.g., for data headers and trailers) then the first and last outputs to the BIB 112 are also controlled by the CU 130. In a typical read, the CU 130 would put the IDB 120 into a "from CU" mode initially, start the read command at the LFI 132, then transfer a header to the BIB 112, then put the IDB 120 into "normal" mode such that the data from the LFI 132 and in the block 163 is transferred to the BEPU. Finally the CU 130 would generate a trailer if necessary.

Figure 5:
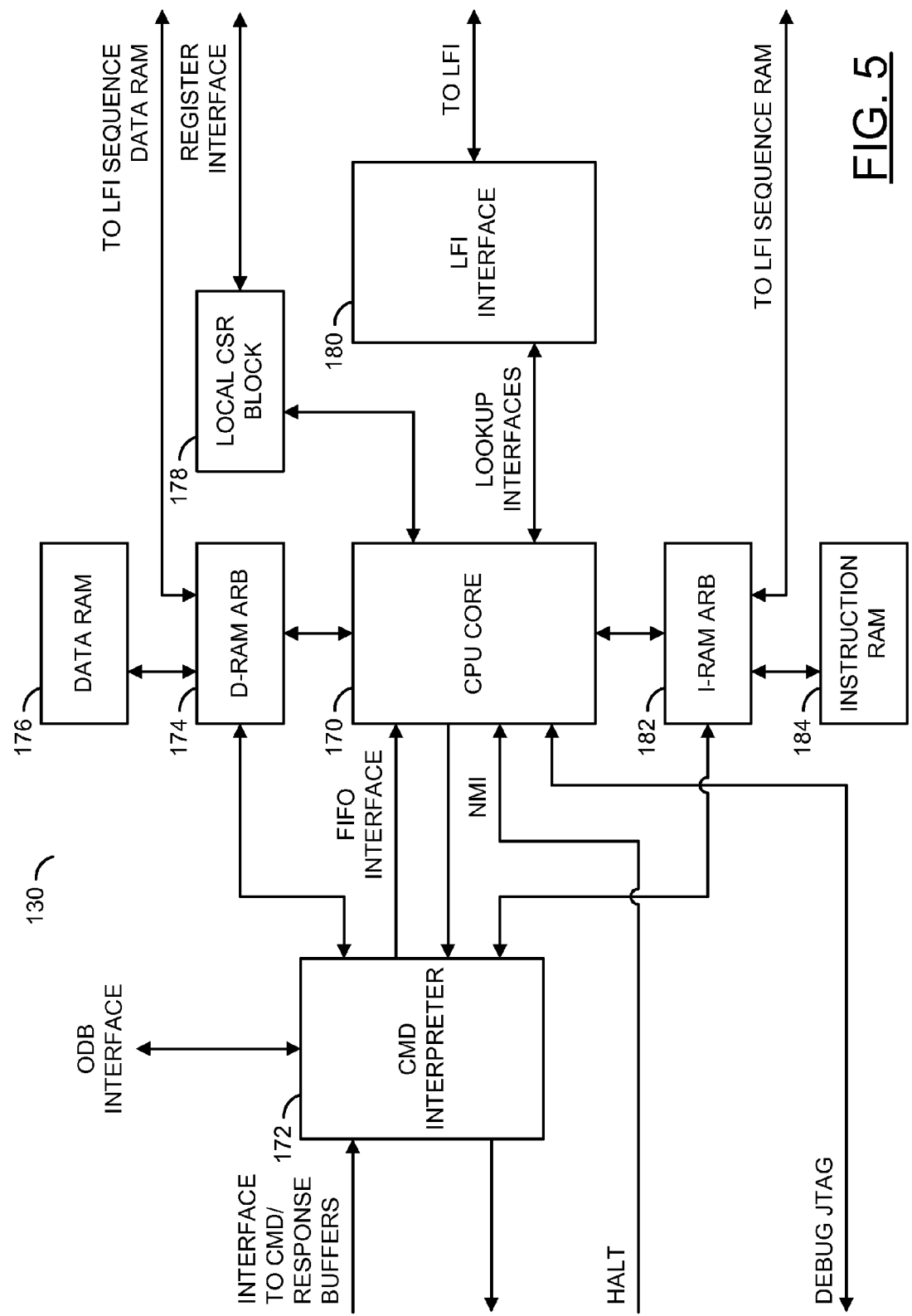
FIG. 5 is a diagram illustrating an example implementation of a control unit of FIG. 2.

Referring to FIG. 5, a diagram is shown illustrating an example implementation of the control unit (CU) 130 of FIG. 2. The CU 130 generally implements a microprocessor based supervisory control unit of the controller 101. The CU 130 receives commands from the output bus (OB), and performs command scheduling and prioritization. In some embodiments, the CU 130 comprises a block (or circuit) 170, a block (or circuit) 172, a block (or circuit) 174, a block (or circuit) 176, a block (or circuit) 178, a block (or circuit) 180, a block (or circuit) 182, and a block (or circuit) 184. The block 170 generally comprises a central processing unit (CPU) core. The block 172 generally implements a command interpreter. The block 174 implements an arbiter. The block 176 implements a random access memory (RAM) for storing data. The block 178 implements a local configuration/status register (CSR) block. The block 180 implements an interface to the LFI 132. The block 182 implements an arbiter. The block 184 implements a random access memory (RAM) for storing instructions.

On startup the CPU 170 is held in reset by a CSR register in the block 178. IMP commands are issued by the BEPU to program the initial state of the instruction RAM 184, a sequence RAM of the LFI 132, and the data RAM 176. The initial state generally comes from a system ROM (not shown). Following the initial programming, the reset is released and the CPU 170 begins executing its initial firmware. The firmware allows the CPU 170 to respond to commands issued from the BEPU. During the initial operation state, the BEPU may bring the final operating code from the non-volatile memory devices to a backend buffer (not shown). The final operating code is used to configure the CPU 170 as well as other CPUs on the system 100. In one example, it is likely at this stage that the CU code will be reloaded with a performance optimized version of the firmware that was stored on non-volatile memory. This generally occurs as a data transfer, and an IMP command is used to direct the incoming IDB data to the instruction RAM 184, the data RAM 176, and/or the sequence RAM of the LFI 132. Typically, the CU 130 would be placed in reset during the loading of the main operating code.

The arbiter 182 and the arbiter 174 may be used on RAM interfaces of the CPU 170 to allow the IMP commands to access the data RAM 176, the instruction RAM 184 and the sequence RAM of the LFI 132. In one example, a stall mechanism of the CPU 170 may be used, giving priority to the IMP command interpreter 172. It is expected, however, that access to the data RAM 176, the instruction RAM 184, and the sequence RAM of the LFI 132 other than by the CPU 170 will only occur at initial configuration.

The CPU 170 may also include input and output FIFO interfaces for passing messages from the BEPU and for providing responses back to the BEPU. The output FIFO interface also is used to pass messages to a direct memory access (DMA) engine (e.g., of the host 103) to begin a data transfer operation.

An interface of the CPU 170 is used to access local CSRs and to issue commands to the LFI 132. In some embodiments using a Tensilica CPU, the interface is a Tensilica Instruction Extension (TIE) look-up interface. The global halt signal (e.g., a signal sent from the host 103 in the event of a power failure or other exceptional condition) may be used to trigger a non-maskable interrupt (NMI) in the CPU core 170.

Figure 6:
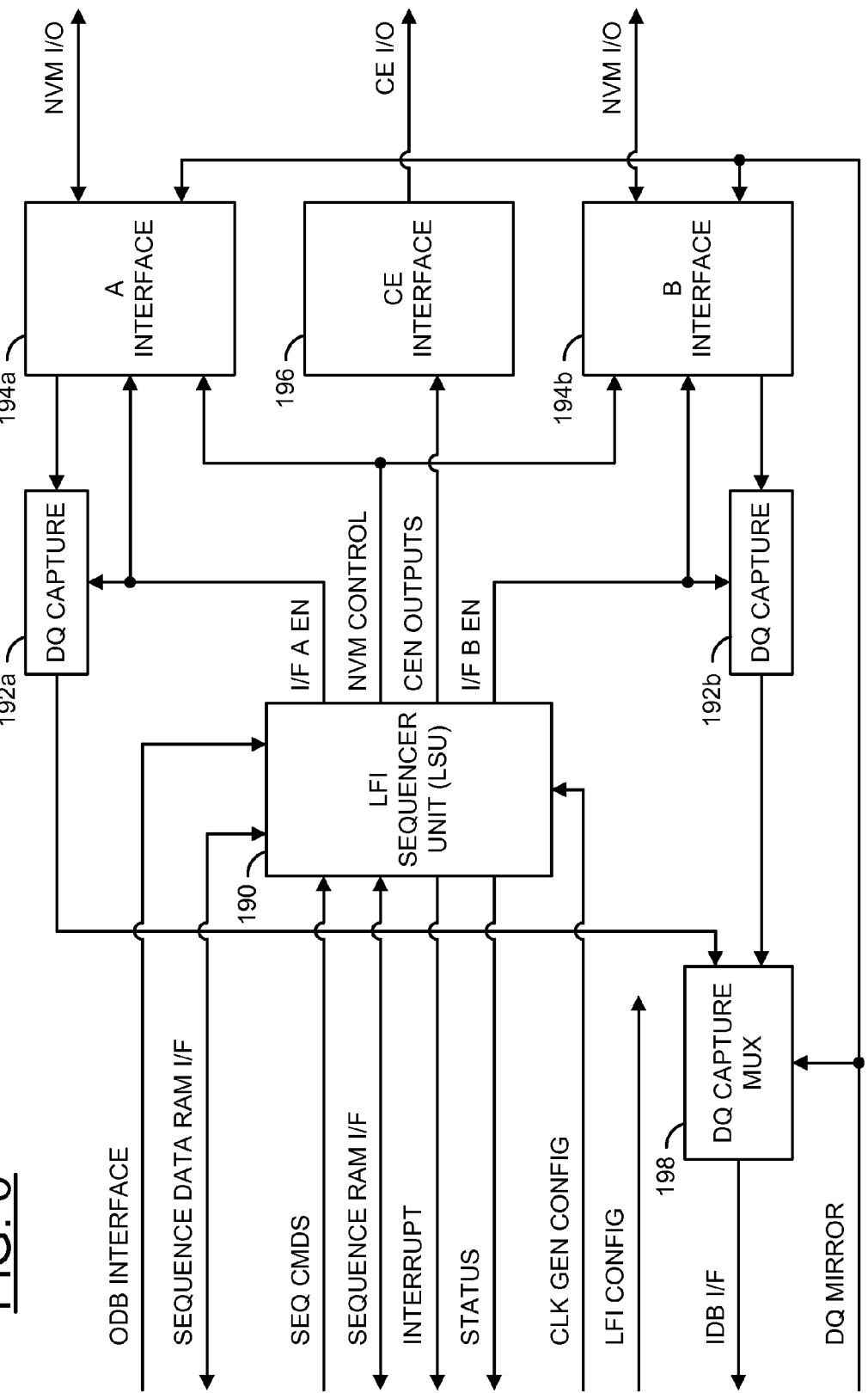
FIG. 6 is a diagram illustrating an example implementation of a low-level non-volatile memory interface of FIG. 2.

Referring to FIG. 6, a diagram is shown illustrating an example implementation of the low-level non-volatile memory interface (LFI) 132 of FIG. 2. The LFI 132 provides the low-level control of the non-volatile memory interfaces. The LFI 132 comprises a programmable sequence engine designed to be configurable for any non-volatile memory interface protocol. The sequences used are configured by the CU 130, and then executed with a command given by the CU 130. There is also a sequence data area that can be programmed by the CU 130 and accessed by the sequences, this way generic sequences can be setup and the data associated with the sequences can be given without modifying the sequences themselves.

In some embodiments, support is provided for two or more physical interfaces rather than only a single physical interface. For example, with two physical interfaces (e.g., A and B), the LFI 132 may comprise a block (or circuit) 190, a block (or circuit) 192a, a block (or circuit) 192b, a block (or circuit) 194a, a block (or circuit) 194b, a block (or circuit) 196, and a block (or circuit) 198. The block 190 generally comprises a low-level non-volatile memory interface (LFI) sequencer unit (LSU). The blocks 192a and 192b generally implement DQ capture blocks. The blocks 194a and 194b implement the A and B non-volatile memory interfaces, respectively. The block 196 implements a chip enable (CE) interface. The block 198 implements a multiplexing circuit for selecting between the two DQ capture blocks 192a and 192b.

The LFI sequencer unit (LSU) 190 executes the sequences and directs the output of non-volatile memory commands, write data transfers and read data transfers. A sequence RAM interface allows internal sequencing memory of the LSU 190 to be set up before sequencing is started, and also to have sequences dynamically programmed by the CU 130. Sequence commands can then be issued on a sequence command interface of the LSU 190. An interface select (e.g., comprising signals I/F A EN and I/F B EN) is programmed with which interface(s) a command is for, and directs commands to the appropriate interface(s). In some embodiments and/or usage scenarios, each command is directed to a single interface. In other embodiments and/or usage scenarios, at least some commands (e.g., a reset command) are directed to multiple interfaces. A chip enable (CE) interface (e.g., comprising signal(s) CEN OUTPUTS) allows full control of CE outputs to select a die(s) that is(are) attached to one of the non-volatile memory interfaces. In some embodiments, configurations with up to eight CEs are supported. The die attached can be on any of the non-volatile memory interfaces.

The DQ capture blocks 192a and 192b provide high speed data capture using DQS, and also a sequential delay capture for asynchronous modes. A DQ Mirror signal controls the mirroring of DQ outputs and captured data. Mirroring swaps bit 0 with 7, 1 with 6, 2 with 5 and 3 with 4. This is done in some designs to ease board layout issues, and must be handled by the controller. Mirror mode is selected by the CU 130 before a command is issued to the LFI 132. Outgoing mirroring is performed at the outgoing interfaces, incoming mirroring is performed following DQ capture in the DQ capture mux 198.

The LFI 132 generally includes a programmable sequence engine, a set of I/O pin output blocks and a set of data capture blocks. The sequence engine typically is programmed with a set of sequences that can execute the non-volatile memory protocol of the particular non-volatile memory devices that are attached to the I/O pins. The sequences comprise a set of instructions that start at a number of locations in the sequence memory. For example, there is a respective start location for each operation that the LFI 132 is programmed to perform. In some embodiments, the sequence memory is implemented as 512 32-bit locations. Execution of a sequence is initiated by issuing a command on the command interface. The command generally includes an address in the sequence RAM to jump to and a byte of command data that can be used by some of the instructions in the sequence, though some sequences do not use the command data.

A sequence data RAM is also provided that is indirectly addressed using an index register. The index is set using a MODE instruction and would typically be set to the value given from the command data. This way any data that is associated with a command sequence can be set in the sequence data RAM, and the sequences themselves do not need to be modified. An example would be a read command that has five bytes of address. The address bytes would be placed in consecutive locations in the sequence data RAM and a command would be issued with the address of the read command sequence in the sequence RAM, and the address of the first byte of the address in the sequence data RAM. The sequence would set the index register and then perform the required sequence to send out the address, and repeat the address sequence for each byte of the address. Instructions cause the index register to be incremented (will wrap after end of memory), though for a WIG instruction (used to wiggle the I/O pins connected to the non-volatile memory devices) the incrementing is optional.

Sequences execute until they encounter an instruction that causes a halt. The halt terminates sequence execution and the LFI enters a state in which the LFI waits for the next command to arrive and performs no further action. The execution of an action to a non-volatile memory device may consist of multiple sequence calls. For example, a sequence could be called to select a device, a separate sequence call could then issue a read, and a final sequence could deselect the device.

Figure 7:
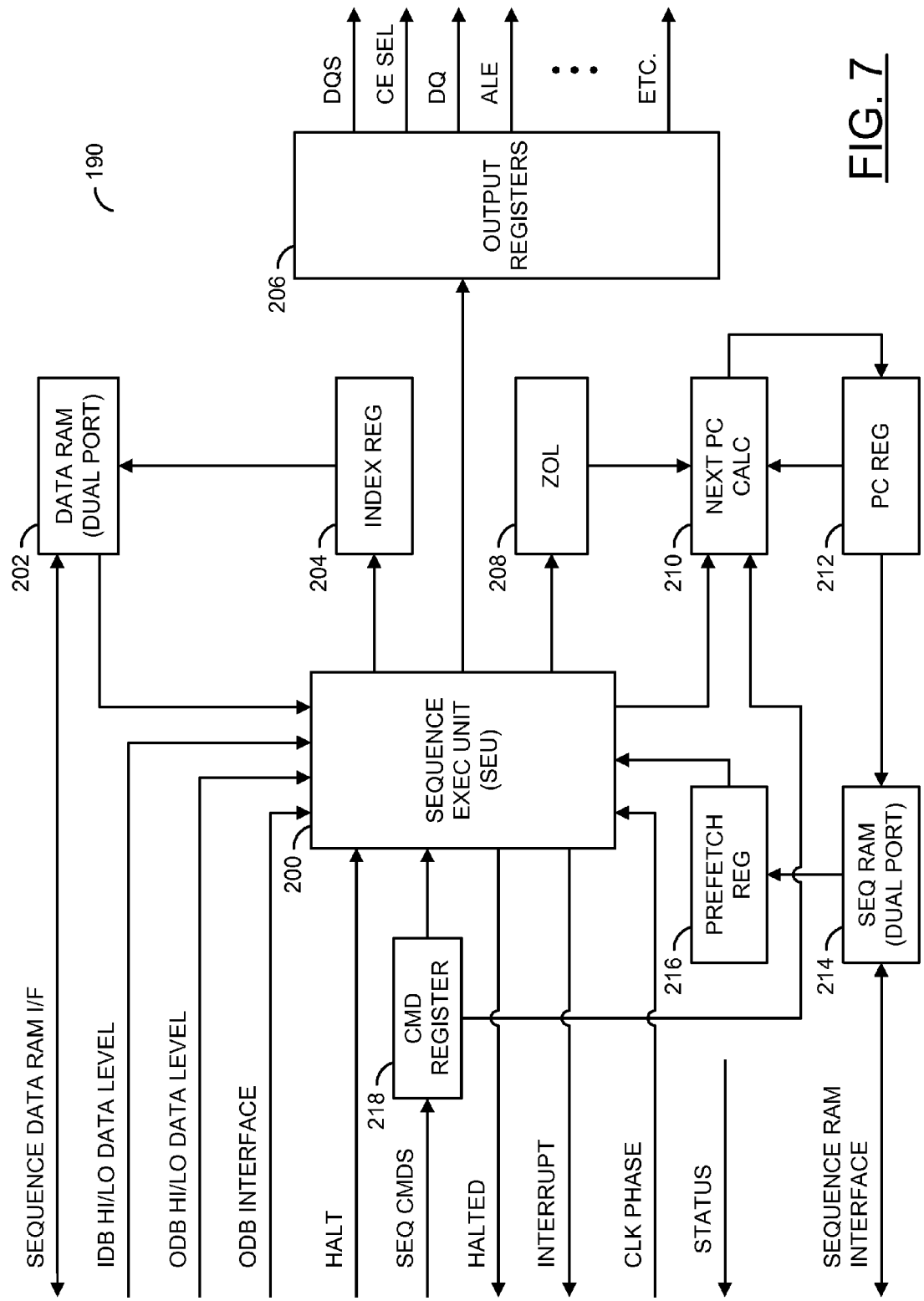
FIG. 7 is a diagram illustrating an example implementation of a low-level non-volatile memory interface sequencer unit of FIG. 6.

Referring to FIG. 7, a diagram is shown illustrating an example implementation of the low-level non-volatile memory interface (LFI) micro-sequencer unit (LSU) 190 of FIG. 6. In some embodiments, the LSU 190 may comprise a block (or circuit) 200, a block (or circuit) 202, a block (or circuit) 204, a block (or circuit) 206, a block (or circuit) 208, a block (or circuit) 210, a block (or circuit) 212, a block (or circuit) 214, a block (or circuit) 216, and a block (or circuit) 218. The block 200 generally comprises a sequence execution unit (SEU). The block 202 generally implements a random access memory (RAM) for storing sequence data (e.g., a sequence data RAM). In one example, the sequence data RAM 202 may be implemented as dual port memory. The block 204 implements an index register. The block 206 implements a number of output registers. The block 208 implements zero overhead loop (ZOL) registers. The block 210 is generally configured to perform a next program counter (PC) calculation. The block 212 implements a program counter (PC) register. The block 214 generally implements a random access memory (RAM) for storing sequences (e.g., a sequence RAM). In one example, the sequence RAM 214 may be implemented as dual port memory. The block 216 implements a prefetch register. the block 218 implements a command register.

The sequence RAM 214 needs to be initialized before any commands can be executed. Initialization of the sequence RAM 214 will typically happen once at startup to perform initial non-volatile memory reads, and then a second time when the main execution code has been loaded from the non-volatile memory devices. The sequence RAM 214 may be implemented, in some embodiments, as 32-bits wide (plus ECC bits) and 512 words deep, with dual ports to allow access from the CU 130 while sequences are executing. In some embodiments, the sequence addresses are 9-bits. However, other memory specification may be implemented accordingly to meet the design criteria of a particular implementation.

The sequence data RAM 202 allows the CU 130 to set various command values that can be accessed by commands using the index register 204. The setting of the various command values can be used for such operations as setting up command/address sequences. In some embodiments, the sequence data RAM 202 is addressed as 32-bit words from the CU 130, but as single bytes by the index register 204. In some embodiments, the sequence data RAM 202 is implemented as 64 bytes (16 words). However, other memory specification may be implemented accordingly to meet the design criteria of a particular implementation. Because the data is prefetched from the sequence data RAM 202, the whole sequence data RAM 202 should be initialized prior to use to prevent potentially spurious ECC errors.

The PC register 212 contains the current sequence pointer. The current sequence pointer usually goes through the incrementer 210 to fetch the next sequence instruction. The ZOL registers 208 support a single level of zero-overhead looping. The output registers 206 connect to and control operation of the non-volatile memory interface.

The sequence RAM 214 and the sequence data RAM 202 are both ECC protected, and exist in the memory map of the CU 130. An ECC error will cause an interrupt to the CU 130, which can then read a register to determine if the error is correctable or not and also which RAM was in error. Any correctable error should usually result in a read scrub of the memory. If an uncorrectable error occurs during a sequence RAM read, then the sequence will also be immediately halted.

An external signal (e.g., HALT) can be asserted by the CU 130 to halt the operation of the sequence execution unit 200 at any time. In general, halting execution of the sequence execution unit 200 immediately terminates the current sequence at a current location. To start a new sequence, a new command needs to be issued. Internal status of the sequence execution unit 200 is available to the CU 130.

Figure 8:
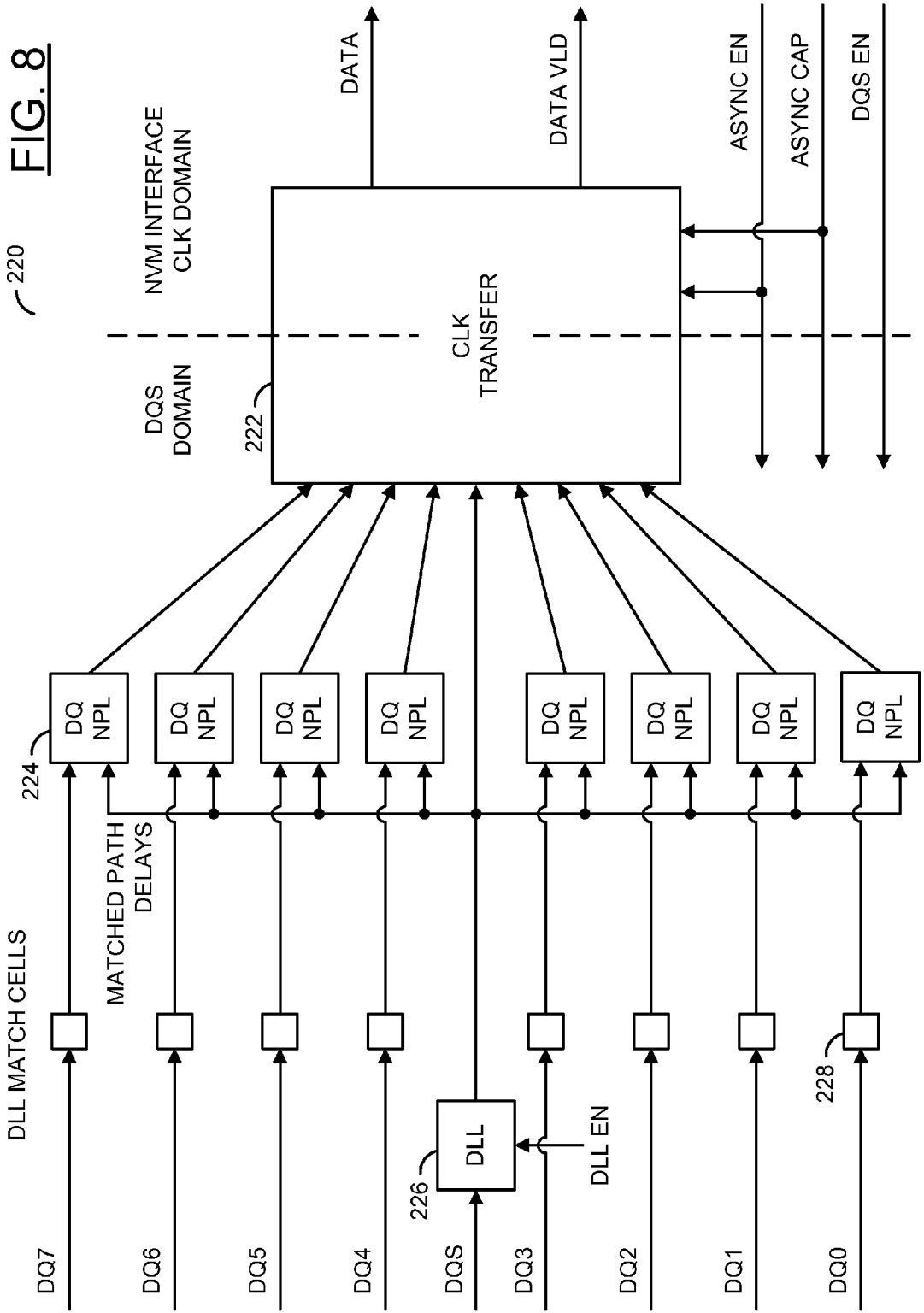
FIG. 8 is a diagram illustrating an example implementation of a DQ capture block of FIG. 6.

Referring to FIG. 8, a diagram is shown illustrating an example implementation of a DQ capture block 220. The DQ capture block 220 may be used to implement the DQ capture blocks 109a and 192b of FIG. 6. In some embodiments, the DQ capture block 220 comprises a clock transfer block 222, a number of DQ near pad logic blocks 224, a DLL block 226, and a number of match cells 228. Near pad logic (NPL) comprises silicon macro blocks that are placed close to the pads. The NPL blocks allow tight control of timing on interface logic. Each NPL block can be placed a fixed distance from an associated pad. A DQS input is passed through a slave module of the DLL block 226. The slave module of the DLL block 226 inserts a quarter DQS cycle delay onto the DQS signal. The DQS path delay to each DQ NPL block 224 should match the DQ delay to the same NPL block. The DQ NPL blocks 224 capture 4 DQ values on subsequent DQS edges. The 4 DQ values are fed to the clock transfer block 222, where the values are transferred to the clock domain of the non-volatile memory interface.

Figure 9:
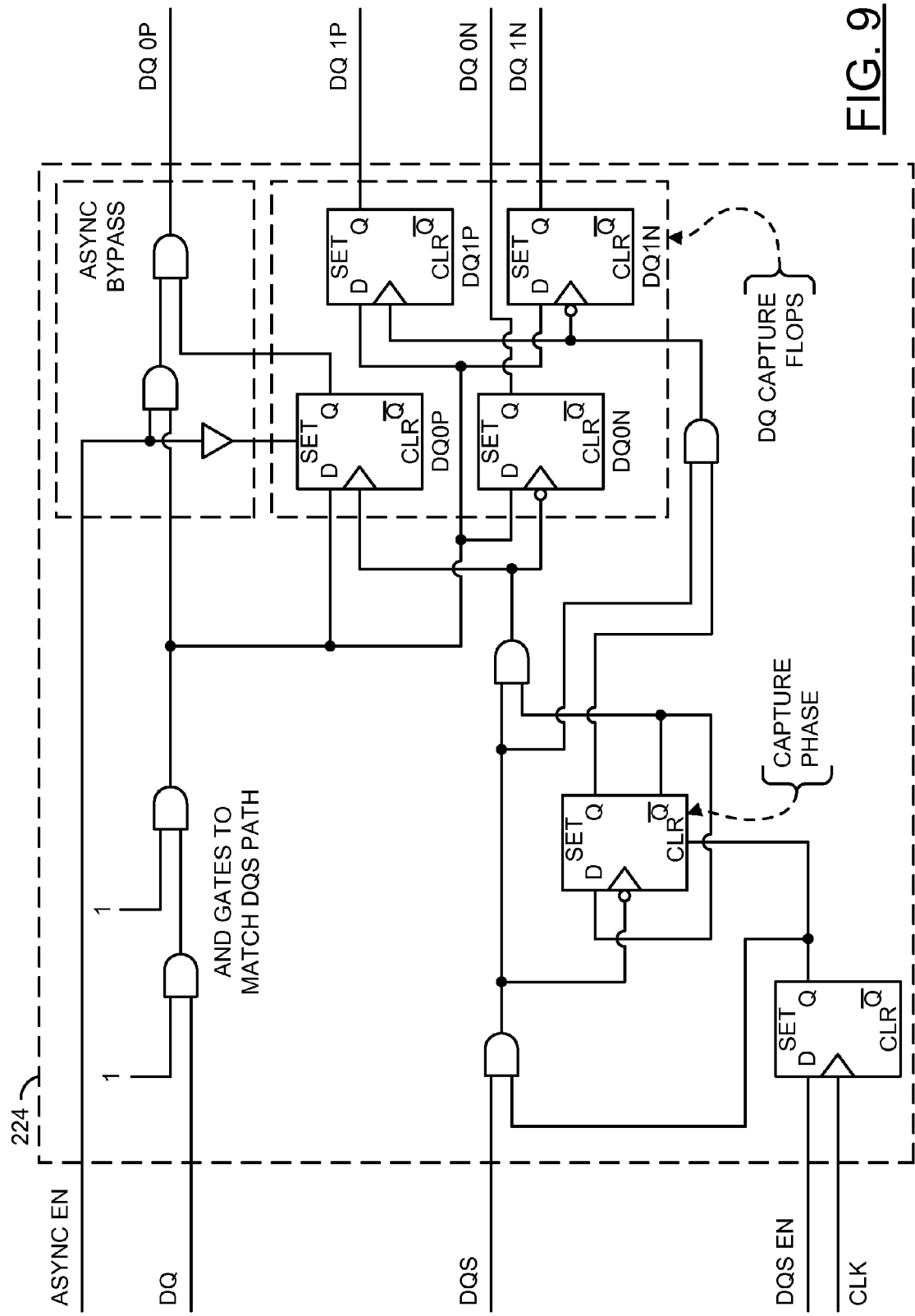
FIG. 9 is a diagram illustrating an example implementation of a DQ capture near pad logic (NPL) block of FIG. 8.

Referring to FIG. 9, a diagram is shown illustrating an example implementation of a DQ capture near pad logic (DQ NPL) block 224 of FIG. 8. In some embodiments, the DQ NPL block 224 comprises a capture phase flop and a number of DQ capture flops (e.g., DQ0P, DQ0N, DQ1P, DQ1N). Prior to the start of a read transfer, a signal (e.g., DQS EN) is LOW, which gates off any DQS glitches and holds the capture phase flop at phase 0. The first rising DQS edge will be captured in the DQ0P flop and the first falling edge will be captured in the DQ0N flop. The first falling edge also switches the capture phase and the next 2 DQS edges are captured in the DQ1P and DQ1N flops, respectively. The cycle repeats every 4 DQS edges while data is transferring.

Figure 10:
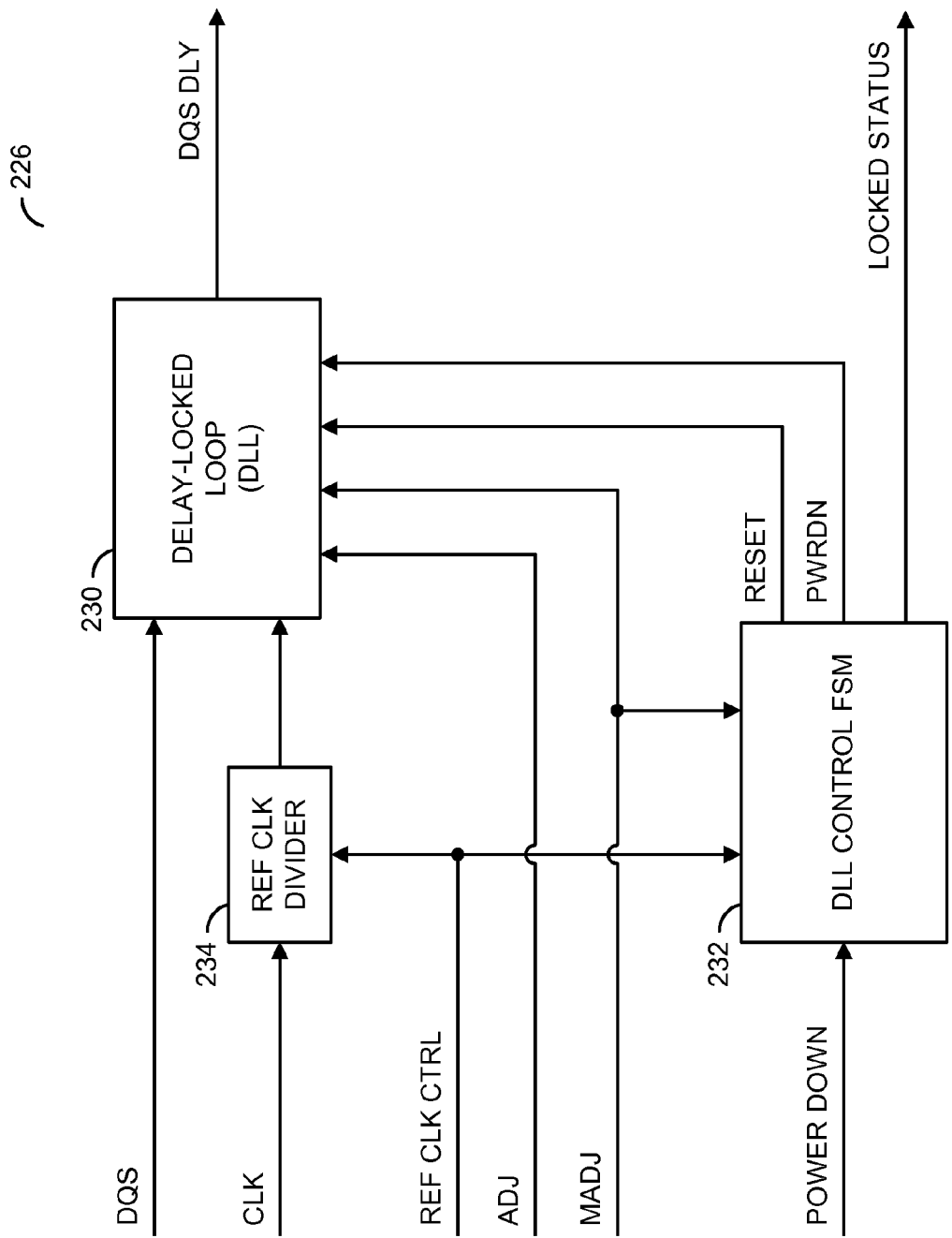
FIG. 10 is a diagram illustrating an example implementation of a DLL block of FIG. 8.

Referring to FIG. 10, a diagram is shown illustrating an example implementation of the DLL block 226 of FIG. 8. In some embodiments, the DLL block 226 comprises a delay-locked loop (DLL) 230 and a control finite state machine (FSM) 232. The DLL 230 comprises a master portion and a slave portion. The master portion of the DLL 230 locks to a supplied reference clock. The slave portion of the DLL 230 delays a given signal (e.g., DQS) by a programmable fraction of the master reference clock. In some embodiments, the incoming DQS signal needs to be delayed by one-quarter of the DQS period in order to capture the edge aligned DQ data. The DLL block 226 locks to the supplied reference cycle. The supplied reference cycle can be the clock of the controller 101 (e.g., CLK) or a divided version of the controller clock (e.g., generated by a reference clock divider 234). Typically the reference clock will be set to the same frequency as the outgoing DQS, or 2× the frequency. The delay inserted should typically be programmed to be about one-quarter of the DQS frequency. The delay through the slave portion of the DLL 230 may be calculated according to the following Equation 2:

$$\text{Delay} = Tf + Tref*((ADJ + ADJoff)/MADJ) \quad \text{EQ. 2}$$

where Tf is a fixed offset delay, Tref is the reference clock period, ADJ is the programmed adjustment offset, ADJoff is a fixed code offset (e.g., 34), and MADJ is the master adjustment offset that is usually set to 160 (but can be changed to a value in the range of 76, . . . , 255). In general, the fixed offset delay Tf is matched by the match cells 228 that are used on the DQ lines, and so can be ignored. Thus, eliminating Tf (e.g., by using the match cells), and solving for ADJ, the following Equation 3 is obtained:

$$ADJ = MADJ*(\text{Delay}/Tref - ADJoff) \quad \text{EQ. 3}$$

In an example case with a 400 MT/s operating condition, the DQS frequency will be 200 MHz, the controller clock will be 400 MHz. In some embodiments, the 400 MHz clock can be fed directly to the DLL and the signal DQS can be delayed by a one-half period of the reference clock (equivalent to one-quarter of a DQS period). In alternative embodiments, the controller clock can be divided to 200 MHz and the signal DQS delayed by one-quarter of the reference clock period.

It is also possible to implement a training scheme in software. In embodiments with such a training scheme, the ADJ value is swept from a low setting to a high setting while a known pattern is read from the non-volatile memory device. The final ADJ would be set to the mid value that resulted in the correct data being read. Any change in the reference clock divider or MADJ or powerdown would need the DLL to be reset for a minimum of 1 us. The control FSM 232 will hold the DLL 230 in reset for a programmed number of clock cycles (e.g., default is 400 for a 1 us period at 400 MHz). The locked status is asserted 500 refclks after the DLL 230 is allowed to run, the status can be checked by firmware before a read operation is initiated.

Control registers for the DLL block 226 can be accessed and set via the CSR ring (e.g., from the BEPU) or locally from the CU 130. Local access is used for training type functions (if necessary) or fine grain power down control. Typically the DLL values are set from configuration records and do not need to be adjusted during normal operation. To save power, a power down request register associated with the DLL control FSM 232 can be set. The DLL 230 is only used during read operations for non-volatile memory read modes that use the DQS input (e.g., DDR modes of ONFI2/3 and Toggle modes). Following exit from power down the reset and lock sequence is activated, and so dynamic powerdown may impact read performance. Upon chip reset the DLL 230 is generally in the powerdown mode.

Figure 11:
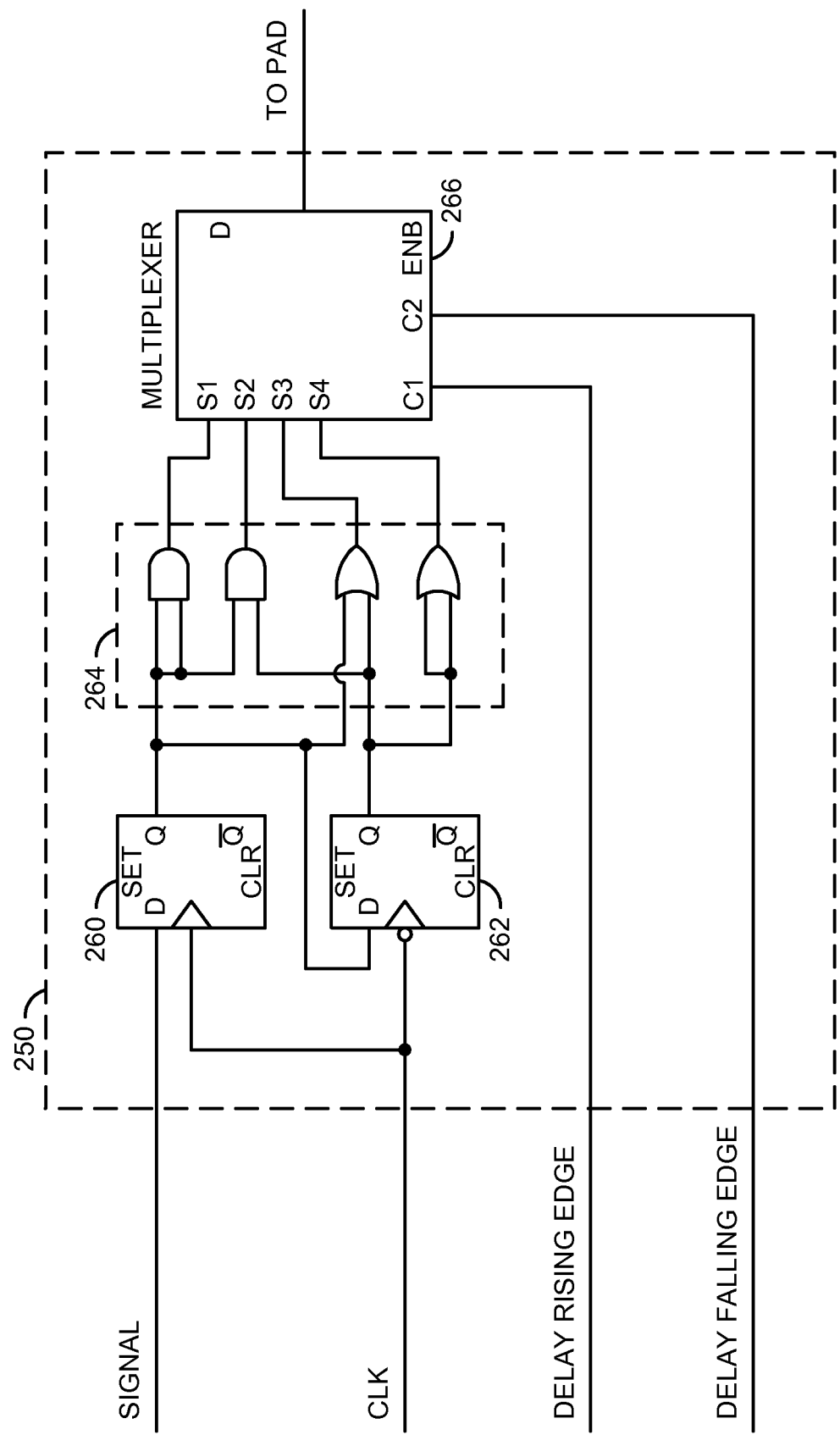
FIG. 11 is a diagram illustrating an example implementation of a output interface near pad logic block.

Referring to FIG. 11, a diagram is shown illustrating an example implementation of an output interface near pad logic (NPL) block 250. Each outgoing signal passes through an output interface NPL block 250. The NPL block 250 allows the outgoing signal to be retimed to the clock (e.g., CLK) and have an optional one-half cycle delay added to the rising and/or falling edge of the outgoing signal. The delay for each outgoing signal is CSR configurable. Each NPL block 250 should be placed close to an associated pad with a matched delay from the NPL block 250 to the pad across all outputs from each controller 101 instance. In some embodiments, the NPL 250 comprises a flip-flop 260, a flip-flop 262, combinational (or combinatorial) logic 264, and a multiplexer 266. In some embodiments, the flip-flops 260 and 262 are implemented as D-type flops. In some embodiments, the combinational logic 264 may comprise AND, OR, and/or NOT gates. Within the NPL 250 each possible path to the multiplexer 266 should be as closely matched as possible.

Figure 12:
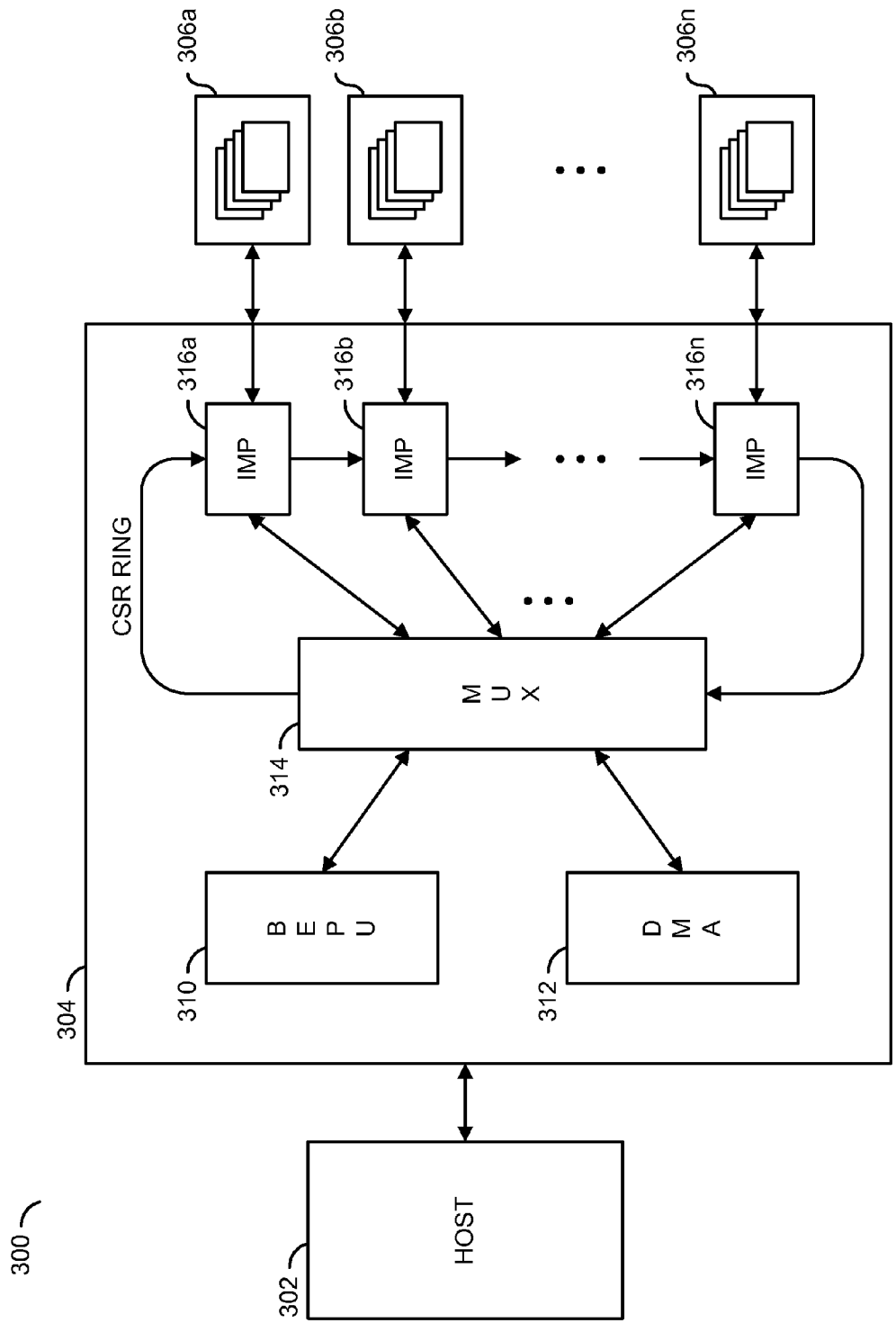
FIG. 12 is a diagram illustrating a non-volatile memory control system with multiple channels in accordance with an embodiment of the invention.

Referring to FIG. 12, a diagram is shown illustrating a non-volatile memory control system comprising multiple channels in accordance with an embodiment of the invention. In some embodiments, a non-volatile memory system 300 may comprise a host 202, a non-volatile memory controller subsystem 304 and a number of non-volatile memory media 306a-306n. The host 302 may communicate with the non-volatile memory controller subsystem 304 via a command interface configured to transfer commands and responses between the host 302 and the non-volatile memory controller subsystem 304. Each of the non-volatile memory media 306a-306n may be connected to a respective channel of the non-volatile memory controller subsystem 304.

In some embodiments, the non-volatile memory controller subsystem 304 may comprise a block 310, a block 312, a block 314, and a number of blocks 316a-316n. The block 310 may comprise a back end processing unit (BEPU) and/or other processors of the non-volatile memory controller subsystem 304. The block 312 may comprise direct memory access (DMA) engine or engines of the non-volatile memory controller subsystem 304. The block 314 may implement a multiplexing subsystem of the non-volatile memory controller subsystem 304. The block 314 may be configured to couple the blocks 316a-316n to the blocks 310 and 312. The blocks 316a-316n may comprise interface management processors implemented similarly to the controller 101 described above. The blocks 316a-316n may be coupled to the block 314 by a CSR ring and respective command interfaces. The blocks 316a-316n may also have non-volatile memory interfaces configured to couple each of the blocks 316a-316n to a respective ones of the non-volatile memory media 306a-306n.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The functions illustrated by the diagrams of FIGS. 1-12 may be implemented (e.g., simulated) using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

Embodiments of the invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

Embodiments of the invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

While illustration of the invention has been particularly shown and described with reference to embodiments thereof, it will be understood by those skilled in the art that various changes in form and details may be made without departing from the scope of the invention.

The invention claimed is:

1. An apparatus comprising:
   a device interface configured to process a plurality of read/write operations to/from one or more non-volatile memory devices;
   a micro-sequencer configured to communicate with the device interface; and
   a programmable sequence memory readable by the micro-sequencer, wherein in response to the apparatus receiving a command, (a) the micro-sequencer executes a set of instructions starting at a location in the programmable sequence memory according to the command and (b) the micro-sequencer is enabled to perform at least a portion of the command according to a protocol of the one or more non-volatile memory devices, when the one or more non-volatile memory devices are coupled to the device interface.

2. The apparatus according to claim 1, wherein the programmable sequence memory comprises a dual port random access memory (RAM).

3. The apparatus according to claim 1, wherein the programmable sequence memory enables the micro-sequencer to perform more than one protocol associated with the one or more non-volatile memory devices.

4. The apparatus according to claim 1, further comprising a control processor coupled to the micro-sequencer and the programmable sequence memory, wherein:
   the control processor is initially enabled to program the programmable sequence memory to enable the micro-sequencer to perform a low-speed protocol compatible with a plurality of types of non-volatile memory devices; and
   the control processor is subsequently enabled to program the programmable sequence memory to enable the micro-sequencer to perform a higher-speed protocol compatible with the one or more non-volatile memory devices, when the one or more non-volatile memory devices are coupled to the device interface.

5. The apparatus according to claim 4, further comprising a programmable sequence data memory coupled between the micro-sequencer and the control processor, wherein the programmable sequence data memory is readable by the micro-sequencer and writeable by the control processor.

6. The apparatus according to claim 5, wherein the programmable sequence data memory stores data associated with one or more command sequences in the programmable sequence memory.

7. The apparatus according to claim 1, wherein the device interface comprises a plurality of data I/O pins and a plurality of control I/O pins.

8. The apparatus according to claim 7, wherein the micro-sequencer is enabled to change a state of the control I/O pins and the data I/O pins to perform the command according to the protocol.

9. The apparatus according to claim 1, further comprising:
an output data interface coupled to the device interface via the micro-sequencer, the output data interface comprising an output data buffer enabled to receive data to be sent to the device interface; and
an input data interface coupled to the device interface via the micro-sequencer, the input data interface comprising an input data buffer enabled to store data received from the device interface.

10. The apparatus according to claim 9, wherein the micro-sequencer is further enabled to (i) detect a full condition of the input data buffer, and (ii) jump in response to detecting the full condition to a determined location in the programmable sequence memory.

11. The apparatus according to claim 1, wherein the device interface and the micro-sequencer are part of a solid state drive (SSD) controller.

12. The apparatus according to claim 1, wherein the apparatus is implemented as one or more integrated circuits.

13. A method of controlling a non-volatile memory channel comprising the steps of:
storing instructions in a sequence memory coupled to a micro-sequencer; and
initiating execution of the instructions by the micro-sequencer at a location in the sequence memory determined according to a command received via a command interface coupled to the micro-sequencer, wherein the micro-sequencer performs at least a portion of the command according to a protocol of one or more non-volatile memory devices coupled to the micro-sequencer.

14. The method according to claim 13, further comprising;
enabling a control processor coupled between the command interface and the micro-sequencer to program the sequence memory to enable the micro-sequencer to perform one or more protocols associated with the one or more non-volatile memory devices coupled to the micro-sequencer.

15. The method according to claim 14, further comprising:
initially enabling the control processor to program the sequence memory to enable the micro-sequencer to perform a low-speed protocol compatible with a plurality of types of non-volatile memory devices; and
subsequently enabling the control processor to program the sequence memory to enable the micro-sequencer to perform a higher-speed protocol compatible with the one or more non-volatile memory devices.

16. An apparatus comprising:
a memory comprising one or more non-volatile memory devices; and
a controller comprising a control processor configured to receive commands from a host and a micro-sequencer comprising a sequence memory readable by the micro-sequencer and writable by the control processor, wherein in response to the controller receiving a particular one of the commands, the control processor enables the micro-sequencer (a) to begin executing an instruction at a location in the sequence memory according to the particular one of the commands and (b) to perform at least a portion of the particular one of the commands according to a protocol of the one or more non-volatile memory devices.

17. The apparatus according to claim 16, wherein the memory and the controller are part of a solid-state drive.

18. The apparatus according to claim 16, wherein the control processor is enabled to receive commands and send responses via a command interface.

19. The apparatus according to claim 16, wherein the micro-sequencer is coupled to the one or more non-volatile memory devices by a device interface.

20. The apparatus according to claim 16, wherein the micro-sequencer further comprises a sequence data memory readable by the micro-sequencer and writable by the control processor, wherein the sequence data memory stores data associated with one or more instruction sequences in the sequence memory.

* * * * *